(12) United States Patent
Wong

(10) Patent No.: US 8,884,676 B2
(45) Date of Patent: Nov. 11, 2014

(54) CLOCK GENERATOR WITH DUTY CYCLE CONTROL AND METHOD

(75) Inventor: Kern Wai Wong, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 375 days.

(21) Appl. No.: 13/215,774

(22) Filed: Aug. 23, 2011

(65) Prior Publication Data

US 2013/0049832 A1 Feb. 28, 2013

(51) Int. Cl.
*G01R 29/02* (2006.01)
*H03K 9/08* (2006.01)
*H03K 3/017* (2006.01)
*H03K 5/04* (2006.01)
*H03K 7/08* (2006.01)
*G06F 1/04* (2006.01)
*H03K 3/00* (2006.01)

(52) U.S. Cl.
CPC ....................................... *H03K 3/017* (2013.01)
USPC ............... 327/291; 327/31; 327/36; 327/172; 327/175; 327/299

(58) Field of Classification Search
USPC ....................... 327/172–176, 31, 36, 291, 299
See application file for complete search history.

(56) References Cited

U.S. PATENT DOCUMENTS

| | | | | |
|---|---|---|---|---|
| 4,620,312 A * | 10/1986 | Yamashita | .................... | 375/238 |
| 4,736,118 A * | 4/1988 | Fischer | ......................... | 327/175 |
| 6,121,805 A * | 9/2000 | Thamsirianunt et al. | ..... | 327/175 |
| 6,822,497 B1 * | 11/2004 | Yao et al. | ...................... | 327/291 |
| 7,123,179 B1 * | 10/2006 | Tagare | .......................... | 341/155 |
| 8,030,985 B2 * | 10/2011 | Nagarajan et al. | ............ | 327/291 |

* cited by examiner

*Primary Examiner* — Lincoln Donovan
*Assistant Examiner* — Colleen O Toole
(74) *Attorney, Agent, or Firm* — Eugene C. Conser; Frederick J. Telecky, Jr.

(57) ABSTRACT

A clock generator circuit for producing a clock output having a controlled duty cycle is disclosed. A bi-stable circuit provides the clock output which is switchable to a first state in response to an edge of the input clock signal and to a second state in response to a feedback signal. A duty cycle detection circuit is configured to source a current to a node and to sink a current from the node depending upon the output clock state. A capacitor is connected to receive a duty cycle current relating to the current at the node, with a comparator circuit being configured to sense a voltage on the capacitor and to produce the feedback signal when the voltage is at a selected level.

4 Claims, 4 Drawing Sheets

CLOCK GENERATOR WITH DUTY CYCLE CONTROL AND METHOD

BACKGROUND OF THE INVENTION

1. Field of the Invention

The present invention relates generally to clock generation circuitry and, in particular, the clock generation which includes duty cycle control.

2. Description of Related Art

There are many applications for clock generation circuitry. In some instances, the clock produced by such circuitry must have a very precise duty cycle. The usual definition of duty cycle is the ratio of the clock high period to the total clock period in terms of percentage. One problem frequently encountered in oscillator and clock generator design is the difficulty in obtaining a symmetrical duty cycle of 50%, which is clock having equal high and low periods. This is particularly true when an odd integer divider is involved. Various circuits and methods have been proposed to address these issues. As will be seen, many of the solutions may provide acceptable performance in some circumstances but are not able to accommodate the precision and wide dynamic rage required in certain applications such as clock drivers used for switching DC to DC converters used in modern integrated power management systems.

Generally, previous designs for duty cycle control utilize a digital delay line approach or an analog delay line approach. Referring to the drawings, FIG. 1 is a simplified diagram of an exemplary prior art clock generator circuit utilizing a digital delay line which is configured to produce a nominal 50% duty cycle which can be varied in a somewhat controlled manner. FIG. 2 is a related timing diagram. Further details of the circuit are disclosed in U.S. Pat. No. 6,822,497, the contents of which are fully incorporated herein by reference. Clock Fin shown in FIG. 2 is provided by an oscillator or other clock generator 20. It can be seen from waveform 28A that the duty cycle of Fin is substantially less than 50%.

Clock Fin and a delayed version DFin (waveform 28B) are coupled to the S and R inputs of a latch 24. The output clock Fout having the controlled duty cycle is produced as the Q output of latch 24. A current controlled delay circuit 22 provides a delay D to produce DFin. In order to provide a nominal 50% duty cycle, delay D has a duration equal to one-half the period of clock Fin. Delay circuit 22 typically includes one or more CMOS gates, having a controllable power supply current which alters the propagation delay through the gates. These delay gates may be followed by R and C elements. In this case, the value of delay D can be altered over a given range by controlling the current through line 32 connected to the power source for the delay gates. The rising edge 34A of clock Fin triggers a one shot within latch 24 to produce a narrow pulse that will set the latch output Q to a high state. The rising edge 34B of delay clock DFin also triggers a one shot within latch 24 which resets the latch causing Fout to switch back to a low state.

A delay setting circuit 30 produces a current on line 32 for setting the duty cycle of Fout. In addition, a duty cycle converter 26 provides a fed back correction current on line 32 to maintain the duty cycle at the desired point. Circuit 26 typically includes a pair of equal current sources, with a first current source charging a capacitor when Fout is in a first state and with the second current source discharging the capacitor when Fout is in a second state, with the voltage on the capacitor representing the duty cycle. Converter 26 produces a correction current on line 32 from the duty cycle voltage on the capacitor which is also indicative of the sensed duty cycle. This correction current in combination with the primary current provided by the current produced by circuit 30 operates to maintain Fout at the desired duty cycle.

FIGS. 3 and 4 illustrate a further approach to producing a clock having a precise duty cycle. Generally, an analog pulse reshaping monostable multivibrator scheme is employed. Further details of this approach are set forth in U.S. Pat. No. 7,123,179, the contents of which are fully incorporated herein by reference. An oscillator circuit 36 produces a clock Fin having a duty cycle in this example of significantly less than 50% (FIG. 4). The rising edge of Fin triggers a one shot 38 that produces a relatively narrow pulse that operates to momentarily turn ON a transistor 40 so as to discharge a capacitor C1. When the pulse terminates, transistor 40 is turned OFF so that a current source 42 can charge capacitor C1 thereby producing a ramp voltage Ramp at the positive input of a comparator 44. The other input to comparator 44 is a voltage Vref to be described.

Comparator 44 produces the clock output Fout. A duty cycle to voltage converter circuit 46 splits Fout into two channels 48A and 48B. The input of channel 48A has an exclusive OR circuit (a high output is produced when the inputs differ), with one input for receiving Fout and the other input connected to a logic "0". The result is Fout+ shown in FIG. 4 which is in phase with Fout. The input of channel 48B also has an exclusive OR circuit with one input for receiving Fout and the other input connected to a logic "1". The result is Fout− shown in FIG. 4 which is out of phase with respect to Fout and Fout+. Circuit 48A includes an RC circuit which operates to integrate Fout− to provide a voltage Vavg1 at node 50A indicative of the duration of the high state of Fout−. Similarly, circuit 48B includes an RC circuit which operates to integrate Fout+ to produce a voltage Vavg2 at node 50B indicative of the high state of Fout+.

An error amplifier 52 provides an output Vref indicative of the difference between Vavg1 and Vavg2 which is filtered by a capacitor C2. Voltage Vref is also indicative of the duty cycle of Fout. If Vavg1 and Vavg2 are equal, the duty cycle is 50%. An offset circuit 52 can be used in one of the channels (Fout+ in this case) to provide an adjustable offset for target duty cycles other than 50%. Comparator 44 changes state when voltage Ramp has increased to Vref, thereby producing a falling edge on Fout. Feedback of voltage Vref tends to maintain Fout at the desired duty cycle.

The above described exemplary approaches for providing an output clock having a controlled duty cycle are adequate under many operating conditions. However, shortcomings exist limiting their use in certain high performance applications. As will become apparent to those skilled in the art upon a reading of the following Detailed Description of the Invention, the present invention addresses many of those shortcomings.

DETAILED DESCRIPTION OF THE INVENTION

Figure 1:
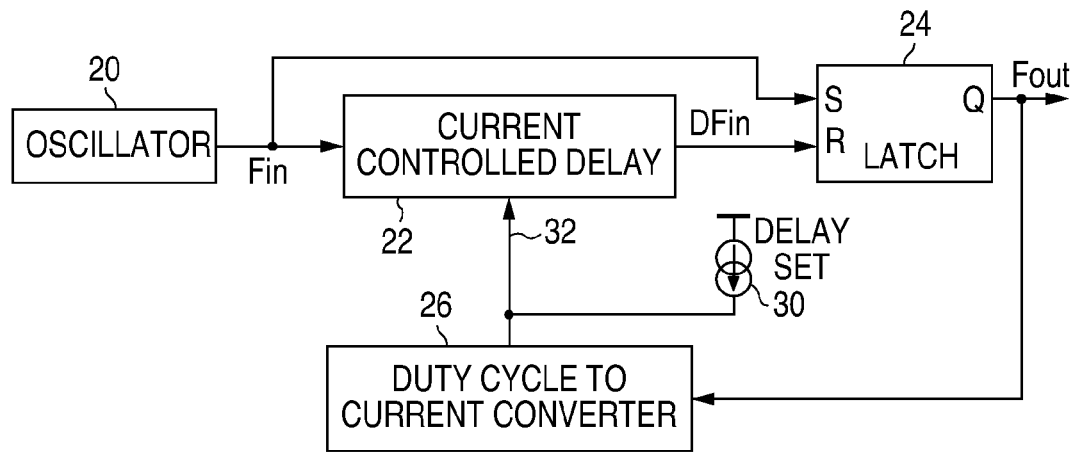
FIG. 1 is a circuit diagram of a prior art clock generator with duty cycle control.
Figure 2:
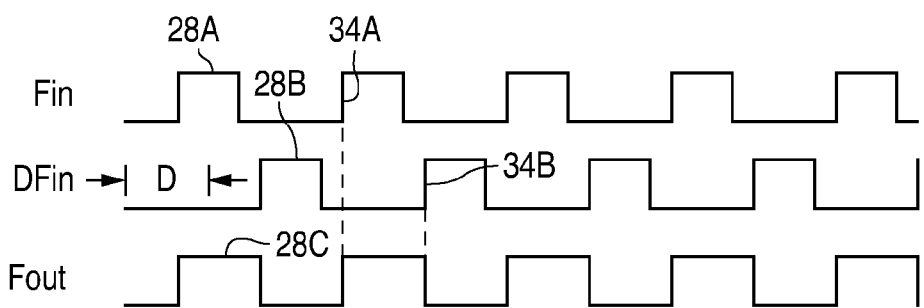
FIG. 2 is a timing diagram illustrating operation of the FIG. 1 clock generator.

Referring again to the drawing, the previously described clock generation circuitry of FIG. 1 provides acceptable performance for many applications. However, current clock accuracy requirements require duty cycle control over a ±50% dynamic range for frequencies ranging from 250 KHz to 6 MHz which translates to a delay circuit with an operable span from ±1 µs to ±42 ns. It is not practical or cost effective to provide this kind of performance using the approach of FIG. 1, including the delay circuit 22. In addition, the duty cycle to current converter 26 tends to be sensitive to variations in power supply and the various RC elements used in the circuit.

Figure 3:
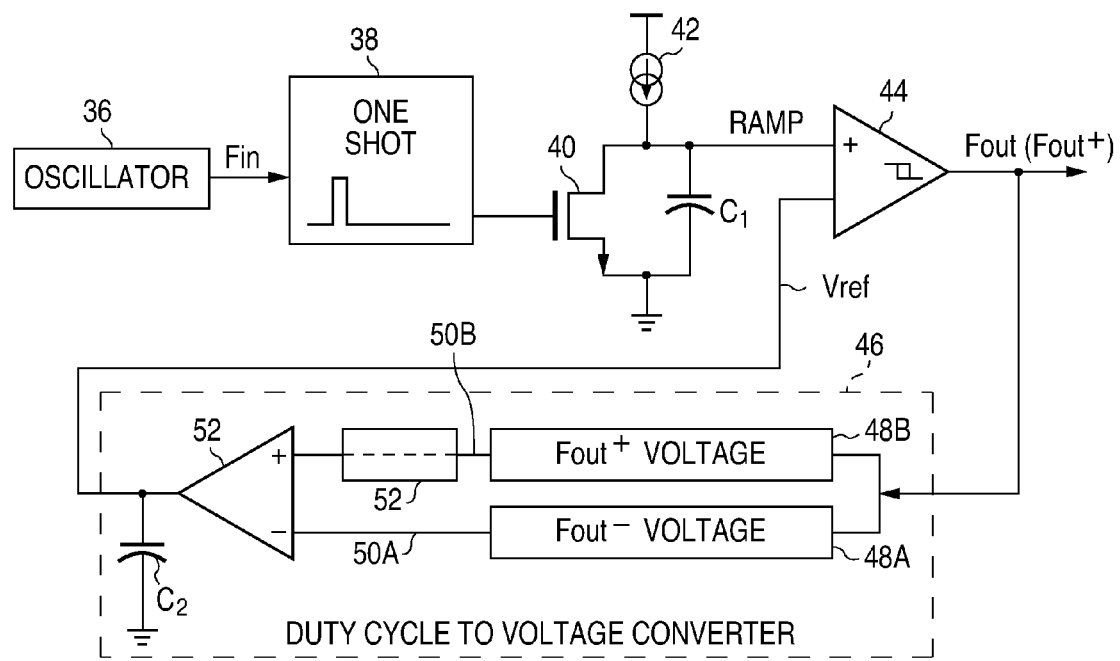
FIG. 3 is a circuit diagram of another prior art clock generator with duty cycle control.
Figure 4:
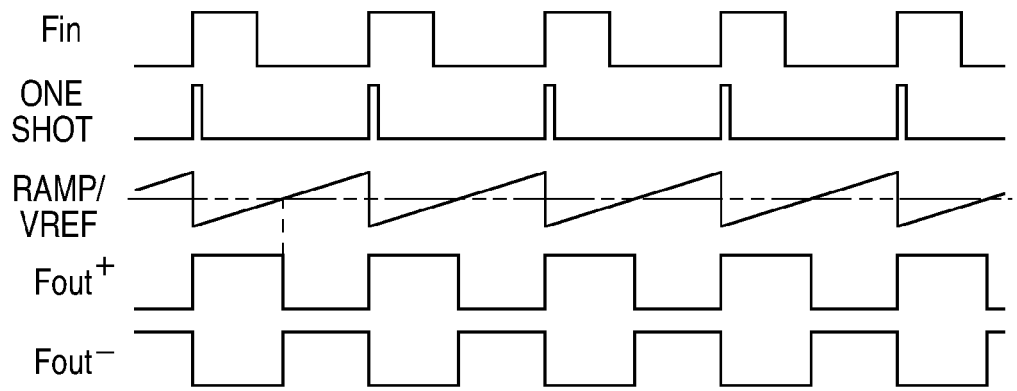
FIG. 4 is a timing diagram illustrating operation of the FIG. 3 clock generator.

Similarly, although the previously described clock generator circuit of FIG. 3 provides a relatively wide range of duty cycles, there are shortcomings. Since a comparator 44 is used directly as a pulse shaper, the slow rising edge of voltage Ramp at the input requires that the comparator have a moderate degree of hysteresis to suppress multiple pulses due to noise. This poses a limitation on generating a high frequency clock. Further, the FIG. 3 circuit is sensitive to variations in power supply voltage(s) because the rail to rail output of comparator 44 is directly integrated by the RC circuits of elements 48A and 48B. These and other errors attributable to supply voltage changes could be mitigated to some extent using an internal LDO voltage regulator, but this adds complexity. Further, a voltage regulator has a limited bandwidth which cannot nullify high frequency noise present on the power supply.

Figure 5:
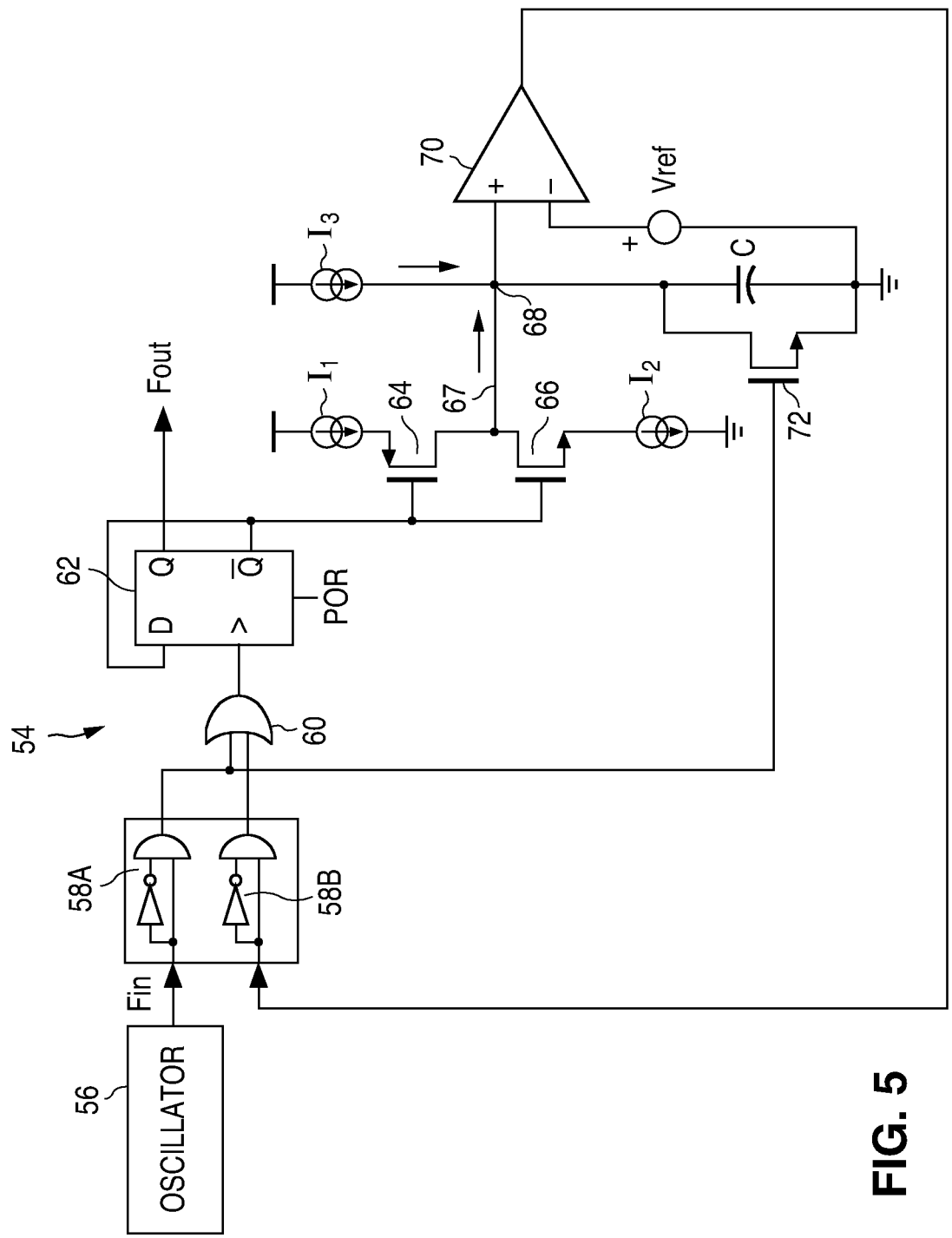
FIG. 5 is circuit diagram of a clock generator circuit in accordance with a first embodiment of the present invention.

FIG. 5 depicts one embodiment of the present invention which addresses the above-described shortcomings. The clock generator circuit 54 includes an oscillator circuit 56 which produces an input clock Fin as shown in the timing diagram of FIG. 5. A first one shot 58A produces an output pulse in response to the rising edge, with the short pulse width corresponding to the delay provided by an inverter (not designated) in the one shot. The pulse operates to clock a bi-stable circuit. In the present case, the bi-stable circuit a D type flip-flop circuit (flip-flop) 62 by way of an OR gate 60. The output clock Fout is produced at the Q output of flip-flop 62. As is well known, a D type flip-flop transfers the state at the D input to the Q output upon receipt of a clock. A power on resent (POR) initializes flip-flop 62 so that the Q output Fin is a "1". Since the D input is connected to the Q_ output, the D input is a "0" so that the Q output Fout transitions to a low state upon receipt of the clock pulse as shown in the FIG. 5 timing diagram. Eventually, a second one shot 58B will be triggered thereby producing a narrow pulse that again clocks flip-flop 62 by way of gate 60, causing the Q output Fout to transition to a high state.

P type transistor 64 and N type transistor 66 form part of a duty cycle detection circuit, with the respective gates connected in common to the Q_ output of flip-flop 62. The respective drain electrodes of the two transistors are connected together, with the source electrode of transistor 64 connected to a current source I1 and with the source electrode of transistor 66 connected to another current source I2, with sources I1 and I2 being equal. Current source I1 and switch 64 are connected intermediate a common node and the upper supply rail (VDD), with current source I2 and switch 66 being connected intermediate the common node and the lower supply rail (ground). Thus, when Q_ is high, transistor 66 is ON and transistor 64 is OFF so that current I2 is sunk from line 67. Conversely, with Q_ is low, transistor 64 is ON and transistor 66 is OFF so that current I1 is sourced onto line 67. When Fout has a 50% duty cycle, the net current flowing though line 67 over time, sometimes referred to as the duty cycle current, is zero.

Figure 6:
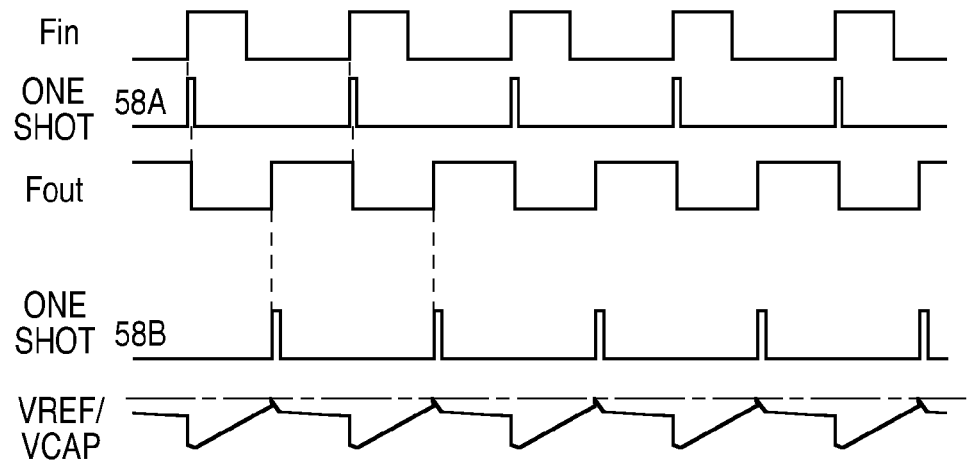
FIG. 6 is a timing diagram illustrating operation of the FIG. 5 clock generator.

A third current source I3 has an output connected to a current summing node 68, with line 67 also being connected to the node. The current one line 67 along with that from source I3 flows through a capacitor C, with the capacitor being charged by the sum of the two currents flowing into node 68. Capacitor C is discharged at the beginning of each cycle when the output of one shot 58A momentarily turns ON a transistor 72. The values of current I1/I2 and I3 along with that of capacitor C are selected such that for a duty cycle near the target duty cycle, the voltage Vcap on node 68 is midway between the power supply rails near the end of each clock cycle. That means that I3 must be substantially larger than I1/I2. A comparator 70 compares the voltage Vcap with a reference voltage Vref, with the comparator 70 output switching to a high state when Vcap has charged up to Vref as shown in the FIG. 6 timing diagram.

When comparator 70 switches to a high state, the rising edge of the output triggers one shot 58B which clocks flip-flop 62 though OR gate 60. Since Q_ is high at this point, the D input is low so that output Q and Fout transition back to the high state. The target duty cycle can be varied by changing the value of Vref and/or the value of I3. Should the actual duty cycle increase from the target value for some reason, transistor 64 will be conductive longer than it should be and transistor 66 will be conductive for too short a time. This means that the net current on line 67 will be too large so that capacitor C will charge more quickly to Vref. This increased rate of change of Vcap means that comparator 70 will change state sooner in the cycle. Thus, feedback provided by comparator 70 to one shot 58B will cause output Q and Fout to switch to the high state earlier in the cycle thereby correcting for the duty cycle error. In the event the duty cycle is below the target value for some reason, the net current on line 67 will be too low so that Vcap will take more time to transition up to Vref. Thus, output Q and Fout will switch to the high state later in the cycle thereby compensating for the duty cycle error. Note that for duty cycles that differ substantially from 50% can be accommodated so that the switching voltage for comparator 70 remains within the ideal operating range.

The voltage references and current sources can be accurately generated by central biasing circuitry. The references should have precision parameters which are independent of temperature and supply voltage and can be process trimmed. Further, pulse width shaping using edge triggered logic such as flip-flop 62 performs time domain filtering which eliminates level/noise issues. Comparator 70 can be a very high speed device which utilizes little or no hysteresis thereby increasing the circuit bandwidth. Circuit complexity is reduced since only a single capacitor need be used versus banks of capacitors and resistors. In addition, only a single comparator need be used. This in combination with current mode processing at node 68, as opposed to integrating voltage signals, results shorter transport delays which also allows higher frequency operation.

Thus, an embodiment of the present invention has been disclosed. Although this embodiment have been described in some detail, changes can be made by those of ordinary skill in the art without departing from the spirit and scope of the present invention as defined by the appended claims.

What is claimed is:

1. A clock generating circuit arrangement for providing at an output terminal, a square wave signal having the same recurrence frequency as the recurrence frequency of an input signal and wherein said square wave signal exhibits a predetermined duty cycle, said circuit arrangement comprising:

an oscillator configured to produce an output having both rising and falling edges sequentially, wherein the output is configured to supply an input clock Fin to the clock generating circuit arrangement;

a first one shot having an input coupled to the output of the oscillator, wherein the one shot is comprised of an AND gate and an inverter, wherein the one shot is configured to produce an output pulse on its output in response to the rising edge of the oscillator output, and wherein the width of the output pulse corresponds with the delay provided by the inverter included in the one shot;

a second one shot, wherein the one shot is comprised of an AND gate and an inverter, wherein the one shot is configured to produce an output pulse on its output in response to the rising edge of the oscillator output, and wherein the width of the output pulse corresponds with the delay provided by the inverter included in the one shot;

a two input OR gate wherein the first input is coupled to the output of the first one shot and the second input of the OR gate is coupled to the output of the second one shot;

a bi-stable D type flip-flop having data D, and power on POR clock inputs, Q and inverted Q outputs, wherein the output of the two input OR gate is coupled with the clock input of the D type flip-flop and the inverted Q output of the D type flip-flop is coupled to the data D input of the D type flip-flop;

wherein the Q output of the D type flip-flop is configured to supply an output clock Fout, also wherein the D type flop-flop is configured to initialize the Q output Fin to a logical "1" when a power on signal pulse is applied to the POR input of the D type flip-flop;

a P type transistor having a source, drain and gate;

an first N type transistor having a source, drain and gate, wherein the gates of the P and N type transistors are coupled together and also to the inverted Q output of the D type flip-flop and also wherein, the drains of the P and N type transistors are coupled together;

a first current source coupled to the source of the P type transistor;

a second current source coupled to the source of the N type transistor, wherein the first and second current sources are equal;

the first current source is coupled to the upper supply rail (VDD) and the second current source is couple to the lower supply rail (Ground);

a comparator having a positive input, a negative input and an output, wherein the output of the comparator is coupled to the input of the second one shot;

a voltage reference coupled between the negative input of the comparator and lower supply rail;

a third current source coupled between upper supply rail and the positive input of the comparator and the two drains of the N and P type transistors;

a second N type transistor having a source, drain and gate, wherein the gate is coupled to the output of the first one shot, the source is coupled to the lower supply rail and the drain is coupled to the positive input of the comparator; and finally a capacitor which is coupled between the source and the drain of the second N type transistor.

2. The clock generating circuit arrangement of claim 1 wherein, the current in the third current source is substantially larger than the currents in either the first current source or the second current source.

3. A method of generating a clock output having a controllable duty cycle, said method comprising:

providing an oscillator circuit, having an output, wherein the oscillator circuit provides an output clock Fin on the oscillator circuit output;

providing first and second one shots, each having an input and an output, wherein the oscillator output is coupled with the input on the first one shot;

providing an OR logic block, having first and second inputs and an output, wherein the output of the first one shout is coupled with the first input of the OR logic block;

providing a D type flip-flop having D, clock and POR inputs and Q and inverted Q outputs, wherein the clock input of the D type flip-flop is coupled with the output of the OR logic block;

providing first, second and third current sources;

providing a P type transistor and a first N type transistor, both having gates, sources and drains;

providing a second N type transistor, having a gate, a source and a drain;

providing a capacitor;

providing a voltage reference;

providing a comparator, having plus and minus inputs and an output;

providing a duty cycle detection circuit wherein:
the gate of the P type transistor is coupled to the gate of the first N type transistor, the inverted Q output of the D type flip-flop and the D input of the D type flip-flop;
the respective drains of the P and first N type transistors are coupled together and to a current summing node;
the first current source is coupled between the source of the P type transistor and the and the upper supply rail VDD;
the second current source is coupled between the source of the first N type transistor and the and the lower supply rail GND, wherein the currents sourced by the first current source and the second current source are equal;
the third current source is coupled between the upper supply rail VDD and the current summing node;
the gate of the second N type transistor is coupled to the first input of the OR logic block;
the source of the second N type transistor is coupled to the lower supply rail GND;
the drain of the second N type transistor is coupled to the current summing node;
the capacitor is coupled between the source and the drain of the second N type transistor;
the plus input of the comparator is coupled to the current summing node;
the output of the comparator is coupled to the input of the second one shot, wherein the output of the second one shot is coupled to the second input of the OR logic block; and
the voltage reference is coupled between the lower supply rail GND and the minus input of the comparator;

producing a power on signal to the POR input of D type flip-flop to initialize the D type flip-flop and the clock generating circuitry;

setting the D type flip-flop to a first state in response to a first edge of the input clock Fin;

setting the D type flip-flop to a second state in response to a feedback signal from the output of the comparator;

producing a first current when the circuit output is in the first state;
producing a second current when the circuit output is in the second state;
producing a duty cycle signal which includes combining the first and second currents;
conducting a current through the capacitor relating to the duty cycle signal;
sensing a voltage in the capacitor and producing the feedback signal based upon a sensed capacitor voltage.

4. The method of claim 3 wherein the conducting of a current through a capacitor relating to the duty cycle signal further includes conducting an offset current through the capacitor.

* * * * *